(12) United States Patent
Bhattacharyya

(10) Patent No.: US 7,442,633 B2
(45) Date of Patent: Oct. 28, 2008

(54) DECOUPLING CAPACITOR FOR HIGH FREQUENCY NOISE IMMUNITY

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 136 days.

(21) Appl. No.: 11/209,425

(22) Filed: Aug. 23, 2005

(65) Prior Publication Data

US 2006/0008978 A1 Jan. 12, 2006

Related U.S. Application Data

(62) Division of application No. 10/752,351, filed on Jan. 6, 2004, now Pat. No. 6,955,960, which is a division of application No. 09/944,986, filed on Aug. 30, 2001, now Pat. No. 6,700,771.

(51) Int. Cl.
*H01L 21/44* (2006.01)

(52) U.S. Cl. .................. 438/597; 438/686; 438/723; 438/781; 257/E21.008; 257/E21.018; 257/E21.021; 257/E21.088; 257/E21.274

(58) Field of Classification Search .......... 438/238, 438/232, 597, 686, 723, 781; 257/E21.008, 257/E21.018, E21.021, E21.274, E21.088, 257/E29.322
See application file for complete search history.

(56) References Cited

U.S. PATENT DOCUMENTS

| | | | |
|---|---|---|---|
| 4,333,808 A | 6/1982 | Bhattacharyya et al. | |
| 4,952,273 A * | 8/1990 | Popov | .................. 216/70 |
| 5,366,586 A | 11/1994 | Samukawa | |
| 5,587,870 A | 12/1996 | Anderson et al. | |
| 5,620,909 A | 4/1997 | Lin et al. | |
| 5,656,834 A | 8/1997 | Grzyb et al. | |
| 5,714,766 A | 2/1998 | Chen et al. | |
| 5,906,670 A | 5/1999 | Dobson et al. | |
| 6,159,620 A | 12/2000 | Heath et al. | |
| 6,245,617 B1 | 6/2001 | Yang et al. | |

(Continued)

OTHER PUBLICATIONS

Bhattacharyya, A., "Physical & Electrical Characteristics of LPCVD Silicon Rich Nitride", *ECS Technical Digest, J. Electrochem. Soc.*, 131(11), 691 RDP, New Orleans,(1984),469C.

(Continued)

*Primary Examiner*—Michael S Lebentritt
(74) *Attorney, Agent, or Firm*—Schwegman, Lundberg & Woessner, P.A.

(57) ABSTRACT

Systems and methods are provided for an on-chip decoupling device and method. One aspect of the present subject matter is a capacitor. One embodiment of the capacitor includes a substrate, a high K dielectric layer doped with nano crystals disposed on the substrate, and a top plate layer disposed on the high K dielectric layer. According to one embodiment, the high K dielectric layer includes $Al_2O_3$. According to other embodiments, the nano crystals include gold nano crystals and gold nano crystals. One capacitor embodiment includes a MIS (metal-insulator-silicon) capacitor fabricated on silicon substrate, and another capacitor embodiment includes a MIM (metal-insulator-metal) capacitor fabricated between the interconnect layers above silicon substrate. The structure of the capacitor is useful for reducing a resonance impedance and a resonance frequency for an integrated circuit chip. Other aspects are provided herein.

52 Claims, 10 Drawing Sheets

U.S. PATENT DOCUMENTS

| | | | |
|---|---|---|---|
| 6,282,079 B1 | 8/2001 | Nagakari et al. | |
| 6,362,012 B1 | 3/2002 | Chi et al. | |
| 6,418,031 B1 * | 7/2002 | Archambeault | 361/762 |
| 6,475,854 B2 | 11/2002 | Narwankar et al. | |
| 6,511,873 B2 | 1/2003 | Ballantine et al. | |
| 6,689,220 B1 * | 2/2004 | Nguyen | 118/695 |
| 6,690,052 B2 | 2/2004 | Park et al. | |
| 6,700,771 B2 | 3/2004 | Bhattacharyya | |
| 6,955,960 B2 | 10/2005 | Bhattacharyya | |
| 2002/0000593 A1 | 1/2002 | Nishiyama et al. | |
| 2002/0090777 A1 * | 7/2002 | Forbes et al. | 438/238 |
| 2002/0175384 A1 * | 11/2002 | Ngai et al. | 257/408 |
| 2006/0007633 A1 | 1/2006 | Bhattacharyya | |

OTHER PUBLICATIONS

Kotz, John C., et al., *Chemistry & Chemical Reactivity, Second Edition*, Saunders College Publishing,(1991),p. 50-51.

Lee, J. , et al., "Effect of polysilicon gate on the flatband voltage shift and mobility degradation for ALD-Al/sub 2/O/sub 3/ gate dielectric", *International Electron Devices Meeting 2000, Technical Digest. IEDM*, (2000),645-648.

Manchanda, L. , "Si-doped aluminates for high temperature metal-gate CMOS: Zr-Al-Si-O, a novel gate dielectric for low power applications", *IEDM Technical Digest, International Electron Devices Meeting*, (Dec. 10-13, 2000),23-26.

* cited by examiner

DECOUPLING CAPACITOR FOR HIGH FREQUENCY NOISE IMMUNITY

RELATED APPLICATION(S)

This application is a divisional of U.S. patent application Ser. No. 10/752,351, filed Jan. 6, 2004 now U.S. Pat. No. 6,955,960; which is a divisional of U.S. patent application Ser. No. 09/944,986 filed on Aug. 30, 2001 now U.S. Pat. No. 6,700,771; each of which is incorporated herein by reference.

TECHNICAL FIELD OF THE INVENTION

This invention relates generally to integrated circuits and, more particularly, to decoupling capacitors for reducing resonance frequency and impendence in high-frequency chip designs.

BACKGROUND OF THE INVENTION

Goals for integrated circuit design include progressively scaling the design to achieve smaller feature sizes, and using faster clock frequencies beyond 1 GHz. Problems encountered in achieving these goals include the increasing voltage droop and the inductive noise of the active switching nodes, and further include the increasing power supply oscillations and the resulting noise that is generated and transmitted across the chip.

These problems are addressed by incorporating on-chip decoupling capacitors into the integrated circuit design. On-chip decoupling capacitors provide a uniform power supply voltage supply ($V_{DD}$) to fast switching nodes and offset the voltage droops caused by resistive and inductive losses in the integrated circuit load. As such, as will be described in more detail below, on-chip decoupling capacitors reduce $\Delta I$ and $\Delta V$ noises in CMOS circuits.

The resonance impedance ($Z_{RES}$) of the chip is directly proportional to the inductive component and inversely proportional to the chip RC as represented by the following equation:

$$|Z_{RES}| \propto \frac{L}{(R_C + R_{DC}) + (C_C + C_{DC})}.$$

The values $R_C$ and $C_C$ represent the resistance and capacitance of the chip, respectively. The values $R_{DC}$ and $C_{DC}$ represent the resistance and capacitance of the decoupling capacitor, respectively. The resonance frequency ($F_{RES}$) of the chip is inversely proportional to the square root of L+C as represented by the following equation:

$$|F_{RES}| \propto \frac{1}{\sqrt{L + (C_C + C_{DC})}}.$$

The $V_{DD}$ oscillation and the $V_{DD}$ noise can be suppressed by a significant and simultaneous lowering of both $Z_{RES}$ and $F_{RES}$.

Conventionally, on-chip decoupling capacitors are fabricated using silicon dioxide ($SiO_2$) capacitance in the form of Metal Oxide Silicon (MOS) capacitors. $SiO_2$ has a low dielectric constant ($K \approx 3.9$), i.e. a low capacitance per unit area, such that a relatively large amount of silicon area is required for a given capacitance. Thus, the use of $SiO_2$ adversely affects both density and yield.

Conventional capacitors that are constructed with defect-free silicon dioxide are characterized as "loss-less" capacitors because, when used as decoupling capacitors, they provide added capacitance to the chip but provide no resistive component. As such, a separate series resistor is often fabricated with conventional on-chip decoupling capacitors to reduce $Z_{RES}$.

It is desirable for a decoupling capacitor to have a controlled and large value of capacitance per unit area, i.e. a high K value, to provide an effective capacitance ($C_{DC}$) in a relatively small area and to have a built-in controlled resistance ($R_{DC}$) in order to control the resonance impedance and the resonance frequency. Thus, it is desirable to provide controlled and effective "lossy" decoupling capacitor structures and processes that provide a significantly larger value of capacitance per unit area and overcome high frequency design challenges.

One known on-chip decoupling capacitor that has an adjustable $Z_{RES}$ includes two thin layers of $SiO_2$ between a silicon substrate and a doped polysilicon plate, and further includes a thin layer of "injector" quality silicon-rich-nitride (SRN), which is described below, between the two thin layers of $SiO_2$. For example, a known capacitive device includes an insulating layer of $SiO_2$ having a thickness of 25 Å, an SRN layer having a thickness of 50 to 85 Å, and an $SiO_2$ layer having a thickness of 15 Å. A known process sequence for forming this device includes growing 25 Å of $SiO_2$ on a silicon substrate. SRN is deposited to a thickness of 50-85 Å using Low Pressure Chemical Vapor Deposition (LPCVD) or Plasma Enhanced Chemical Vapor Deposition (PECVD). A Rapid Thermal Anneal (RTA) in $O_2$ ambient is performed, and the top oxide and SRN layers are patterned and etched such that the SRN layer is left only over N-well regions in the silicon substrate for subsequent capacitor formation. The bottom oxide is removed to form field effect transistor (FET) gate regions and gate oxide is grown. Polysilicon is deposited, doped and patterned to simultaneously form FET gates and the top plate of the capacitor device.

The above-described known on-chip decoupling capacitor is limited by the scalability of the $SiO_2$ film thickness, and requires a large silicon area to provide a significant value of capacitance due to the inherently low dielectric constant of $SiO_2$. Furthermore, even though superior to conventional oxide, this known on-chip decoupling capacitor has a defect, yield and reliability impact similar to thin $SiO_2$ gate films.

Therefore, there is a need in the art to provide a system and method that overcomes these problems. The present invention overcomes the above limits of scalability, yield and reliability and provides design solutions for significantly higher frequency ranges, lower voltages, and smaller feature sizes for future generations of integrated circuit design.

SUMMARY OF THE INVENTION

The above mentioned problems are addressed by the present subject matter and will be understood by reading and studying the following specification. An on-chip decoupling device and method is provided. A resonance impedance and a resonance frequency for an integrated circuit chip are reduced using a lossy decoupling capacitor that has a large capacitance per unit area (high K value) and a built-in controlled resistance. The lossy decoupling capacitor includes a high K dielectric layer doped with nano crystals. The lossy decoupling capacitor has a number of variables that can be manipulated to provide the desired capacitance and resistance for simultaneously lowering the resonance impedance and resonance frequency for the chip. These variables are also capable of being manipulated for scaling purposes in high clock frequency and high speed switching designs.

One aspect of the present subject matter is a capacitor insulator structure. One embodiment of the capacitor insulator structure includes a high K dielectric layer and nano crystals. The nano crystals are dispersed through the high K dielectric.

One aspect of the present subject matter is a capacitor. One embodiment of the capacitor includes a substrate, a high K dielectric layer doped with nano crystals disposed on the substrate, and a top plate layer disposed on the high K dielectric layer. According to one embodiment, the high K dielectric layer includes $Al_2O_3$. According to other embodiments, the nano crystals include gold nano crystals and silicon nano crystals.

One capacitor embodiment includes a MIS (metal-insulator-silicon) capacitor fabricated on a silicon substrate, and another capacitor embodiment includes a MIM (metal-insulator-metal) capacitor fabricated at lower temperature between the interconnect layers above a silicon substrate. The MIS capacitor directly consumes the silicon area for fabrication of the capacitors, but potentially requires less processing steps when appropriately integrated with the gate insulator processing. The MIM capacitor does not directly impact silicon area and potentially provides a large area for capacitor fabrication. However, the MIM capacitor potentially impacts the number of required interconnect layers which adds mask level and processing cost.

One aspect of the present subject matter is an integrated circuit. One embodiment of the integrated circuit includes a power source, an integrated circuit load coupled to the power source, and a lossy decoupling capacitor coupled to the integrated circuit load to lower the resonance impedance and the resonance frequency. The integrated circuit load is characterized by a resonance impedance and a resonance frequency, and includes an inductive load, a resistive load, and a capacitive load. The lossy decoupling capacitor has a large capacitance per unit area (high K value) and a built-in controlled resistance. The lossy decoupling capacitor includes a high K dielectric layer doped with nano crystals disposed on a substrate, and a top plate layer disposed on the high K dielectric layer.

One aspect of the present subject matter provides a method of reducing a resonance impedance and a resonance frequency for an integrated circuit chip. According to one embodiment of this method, a decoupling capacitor is formed by providing a first plate, a second plate, and a dielectric formed from a layer of alumina ($Al_2O_3$) doped with nano crystals. The decoupling capacitor is coupled to the integrated circuit.

These and other aspects, embodiments, advantages, and features will become apparent from the following description of the invention and the referenced drawings.

DETAILED DESCRIPTION OF THE INVENTION

Figure 1:
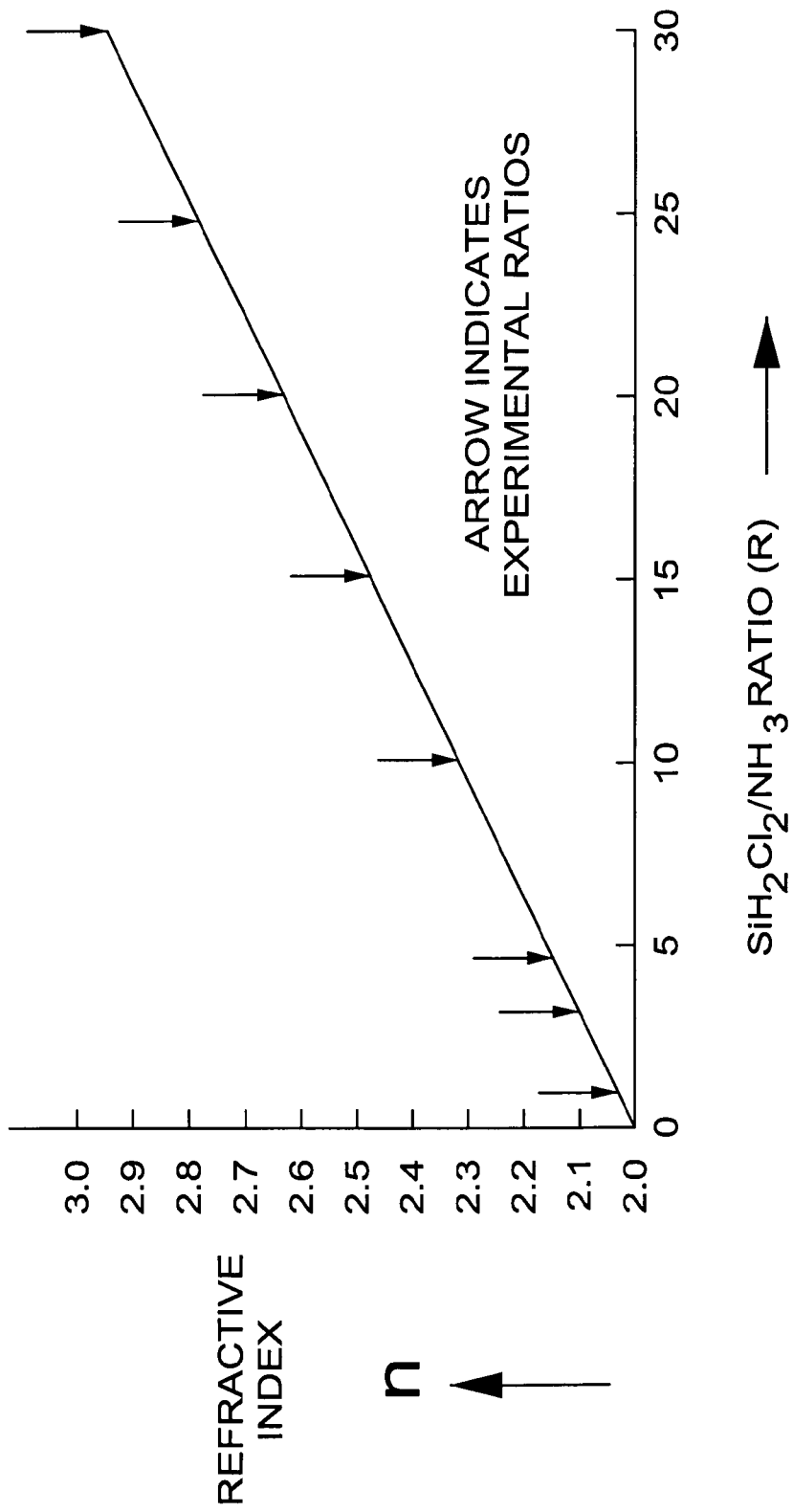
FIG. 1 is a graph showing refractive index of silicon-rich silicon nitride films versus $SiH_2Cl_2/NH_3$ flow rate ratio.

The following detailed description of the invention refers to the accompanying drawings which show, by way of illustration, specific aspects and embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Figure 2:
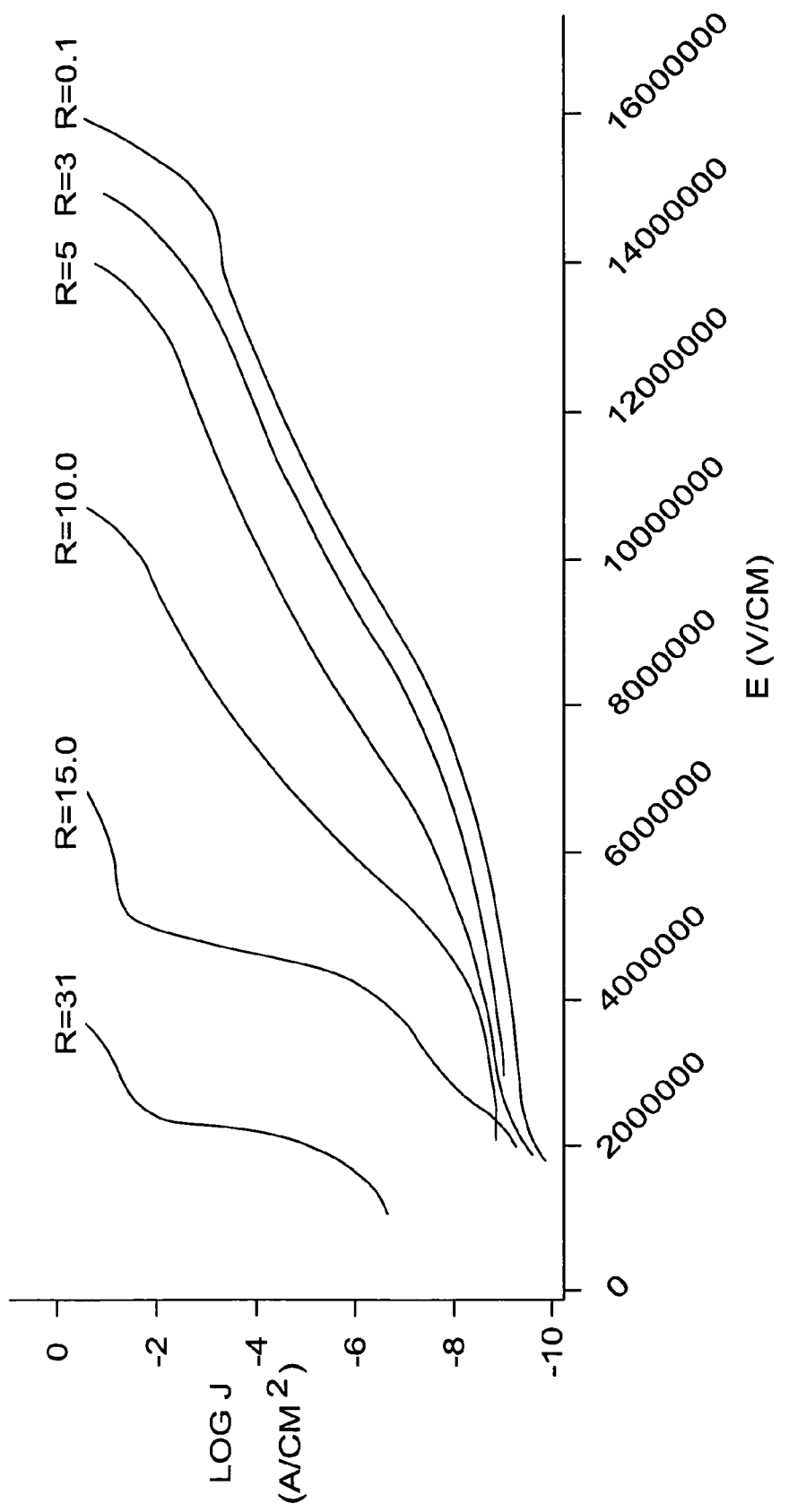
FIG. 2 is a graph showing current density versus applied field for silicon-rich silicon nitride films having different percentages of excess silicon.
Figure 3:
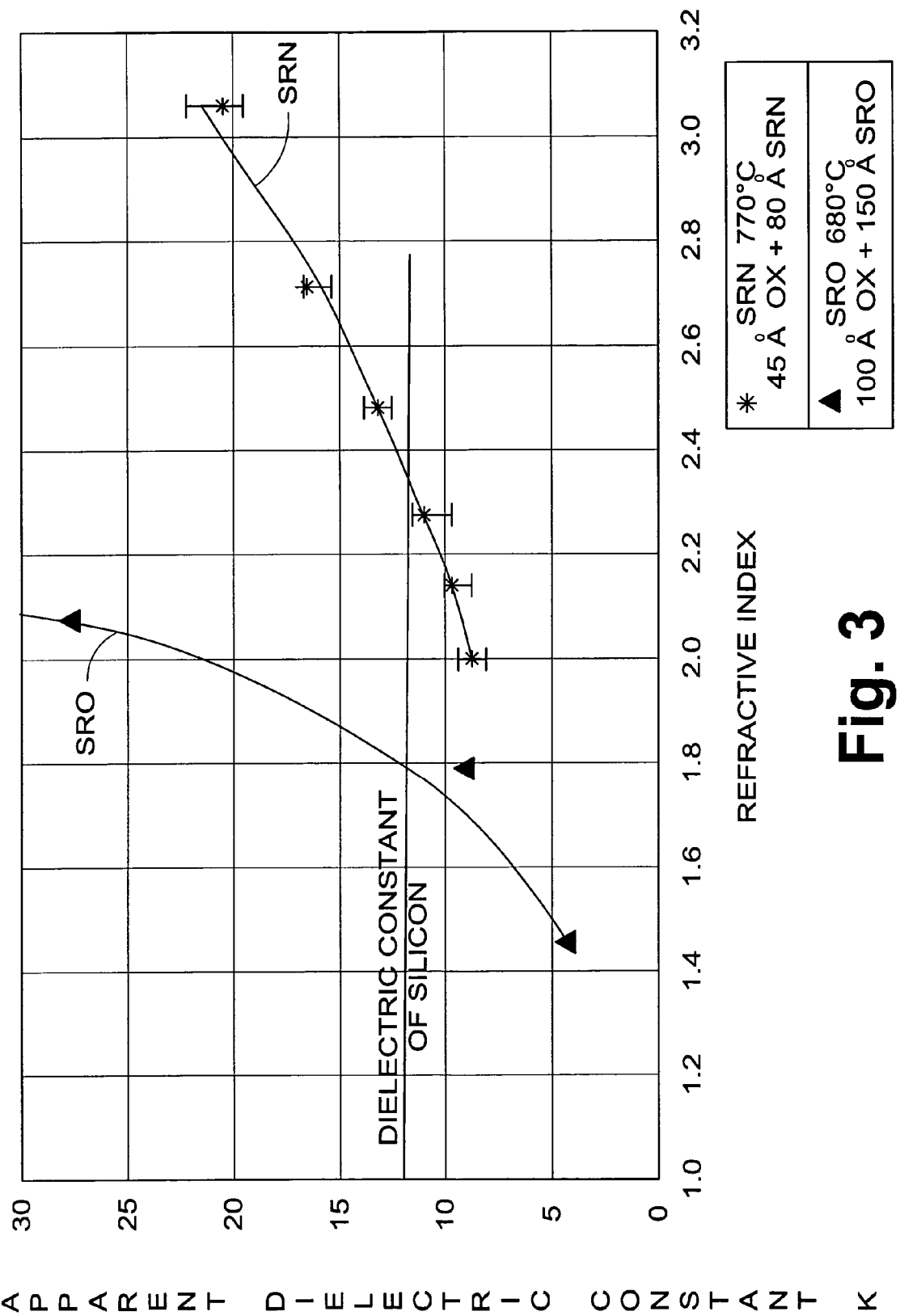
FIG. 3 is a graph showing apparent dielectric constant K versus refractive index for both silicon rich nitride (SRN) and silicon rich oxide (SRO).

Silicon-rich nitride (SRN), or more particularly, injector SRN was referenced in the Background of the Invention. SRN is a subset of silicon rich insulator (SRI). Another subset of SRI is silicon rich oxide (SRO), or more particularly, injector SRO. FIGS. 1-3, described below, are included to elaborate on the characteristics of SRN, including injector SRI.

FIG. 1 is a graph showing refractive index of silicon-rich silicon nitride films versus $SiH_2Cl_2/NH_3$ flow rate ratio (R). This figure is provided herein to illustrate the known relationship between the silicon amount and the refractive index in the film. The graph indicates that the index of refraction increases linearly with increasing silicon content. As such, the index of refraction of the films can be used as an indication of the silicon content of the films.

FIG. 2 is a graph showing current density versus applied field for silicon-rich silicon nitride films having different percentages of excess silicon. The current density (J) is represented in amperes/$cm^2$, and log J is plotted against the electric field E (volts/cm) for $Si_3N_4$ layers having a $SiH_2Cl_2/NH_3$ flow rate ratio R of 0.1, 3, 5, 10, 15 and 31. This figure is provided herein to illustrate the known relationship between the amount of silicon and the conductivity of the film. The plot shows that the $Si_3N_4$ layers having small additions of silicon (R=3 and 5) exhibit a relatively small conductivity increase over stoichiometric $Si_3N_4$. The plot further shows that increasing silicon content at or above R=10 substantially increases or enhances the conductivity.

Silicon-rich nitride films having an R greater than 10 (or, more specifically, having an index of refraction greater than 2.3) are referred to as an injector medium. A silicon-rich $Si_3N_4$ (SRN) injector provides appreciably enhanced charge conductance without providing significant charge trapping similar to the characteristics of semi-metals.

Silicon nitride injectors are preferred over silicon oxide injectors because the two-phase nature of the interface is believed to provide a localized electric field distortion and an associated high current. At elevated processing temperature, silicon readily diffuses within silicon oxide and changes the size and geometry of silicon crystals, which disrupts the injection threshold by reducing the localized field distortions. However, silicon does not readily diffuse within $Si_3N_4$. Furthermore, SRN is chemically passive against chemical solutions as well as an effective barrier against n or p type dopant diffusion; that is, against phosphorus or boron respectively.

FIG. 3 is a graph showing apparent dielectric constant K versus refractive index for both silicon rich nitride (SRN) and silicon rich oxide (SRO). The SRN and SRO plotted in this graph were provided using a Low Pressure Chemical Vapor Deposition (LPCVD) process. The SRO was fabricated at approximately 680° C., and the fabricated structure included 100 Å oxide and 150 Å SRO. The SRN was fabricated at approximately 770° C., and the fabricated structure included 45 Å oxide and 80 Å SRO. As shown in the graph, the dielectric constant of silicon is around 12. Materials with a higher K than silicon are conventionally termed a high K material, and materials with a lower K than silicon are conventionally termed a low K material. Injector SRN are those that have a refractive index of 2.5 or greater and injector SRO are those that have a refractive index of 1.85 or greater. Injector SRN and injector SRO have apparent dielectric constants that are greater than 12. Injector SRI includes both high K SRO and high K SRN.

Thus, as illustrated by FIGS. 1-3, injector SRN provides enhanced charge conductance. Controlling the dispersion and amount of silicon in injector SRN controls the resistivity of the film in which the injector SRN is deposited.

Figure 4:
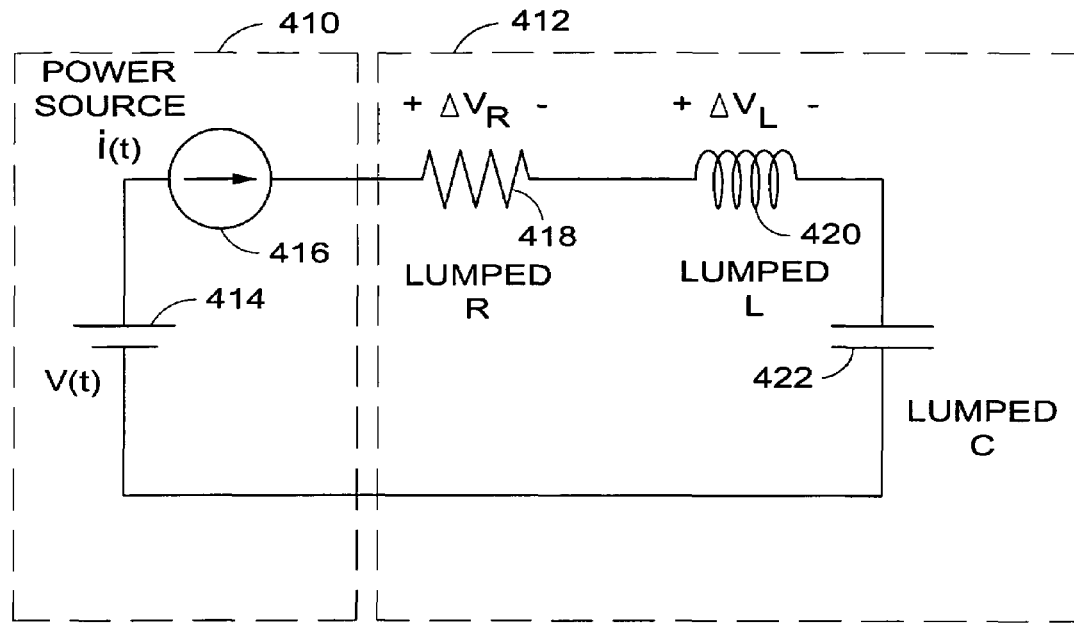
FIG. 4 is a lumped model illustrating the resistive and inductive losses for an integrated circuit.

FIG. 4 is a lumped model illustrating the resistive and inductive losses for an integrated circuit. The model includes a power source 410 and an integrated circuit load 412. The power source 410 is represented by both a voltage source 414 and a current source 416. The integrated circuit load 412 has a resistive component 418, an inductive component 420, and a capacitive component 422. These are represented in this model as a lumped resistance, a lumped inductor and a lumped capacitor connected in series. The lumped resistance contributes to signal loss as represented by $\Delta V_R$. The lumped inductor also contributes to signal loss as represented by $\Delta V_L$.

Figure 5:
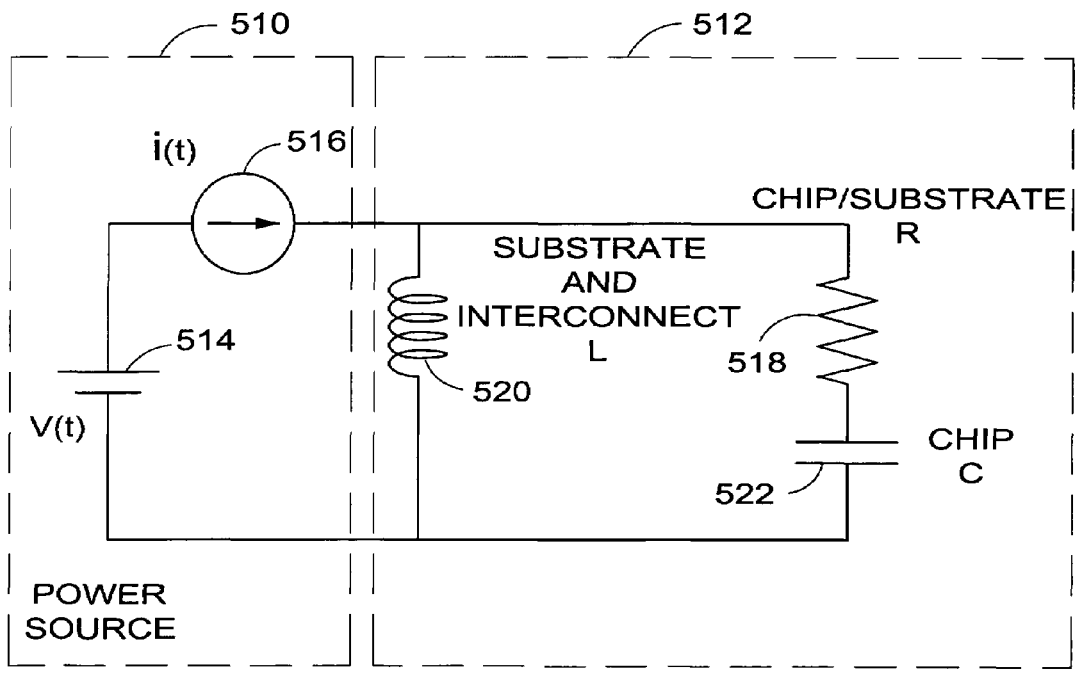
FIG. 5 is another model of the electrical behavior for an integrated circuit.

FIG. 5 is another model of the electrical behavior for an integrated circuit. This model also includes a power source 510 and an integrated circuit load 512. The power source 510 is represented by both a voltage source 514 and a current source 516. The integrated circuit load 512 has a resistive component 518, an inductive component 520, and a capacitive component 522. The resistive component 518 is attributable to the resistance of the chip/substrate. The inductive component 520 is attributable to the inductance in the substrate and interconnect. In this model, the resistive component and capacitive component are connected in series with each other, and are connected in parallel with the inductive component.

Figure 6:
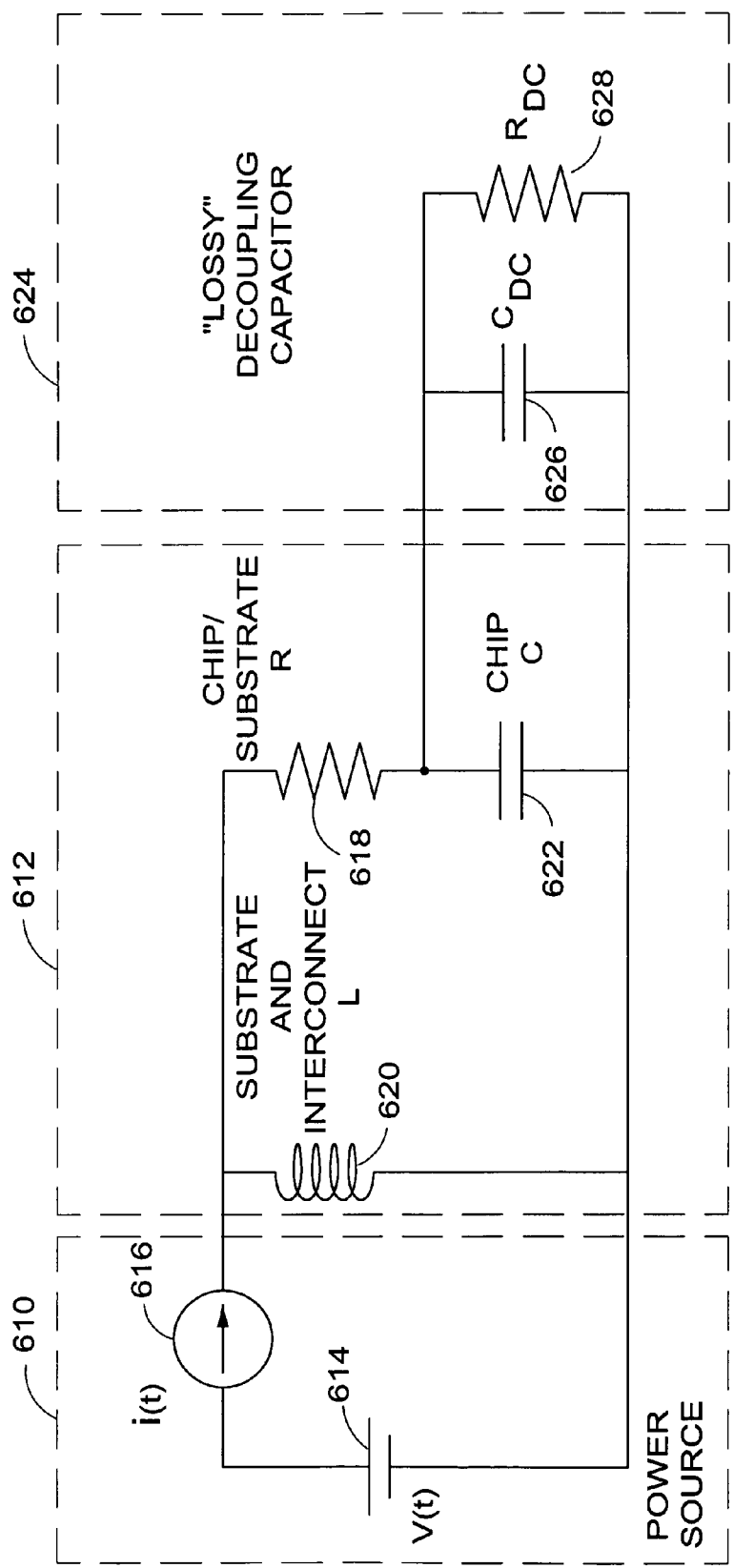
FIG. 6 is the integrated circuit model of FIG. 7 with a lossy decoupling capacitor.

FIG. 6 is the integrated circuit model of FIG. 5 with a lossy decoupling capacitor. The lossy decoupling capacitor 624 is coupled in parallel with the chip capacitive component 622 of the integrated circuit load 612. The model for the lossy decoupling capacitor 624 includes a decoupling capacitor ($C_{DC}$) 626 coupled in parallel with a decoupling resistor ($R_{DC}$) 628. As provided earlier, increasing $C_{DC}$ and $R_{DC}$ lowers the resonance impedance ($Z_{RES}$) and the resonance frequency ($F_{RES}$) and suppresses the $V_{DD}$ oscillation and the $V_{DD}$ noise.

Figure 7:
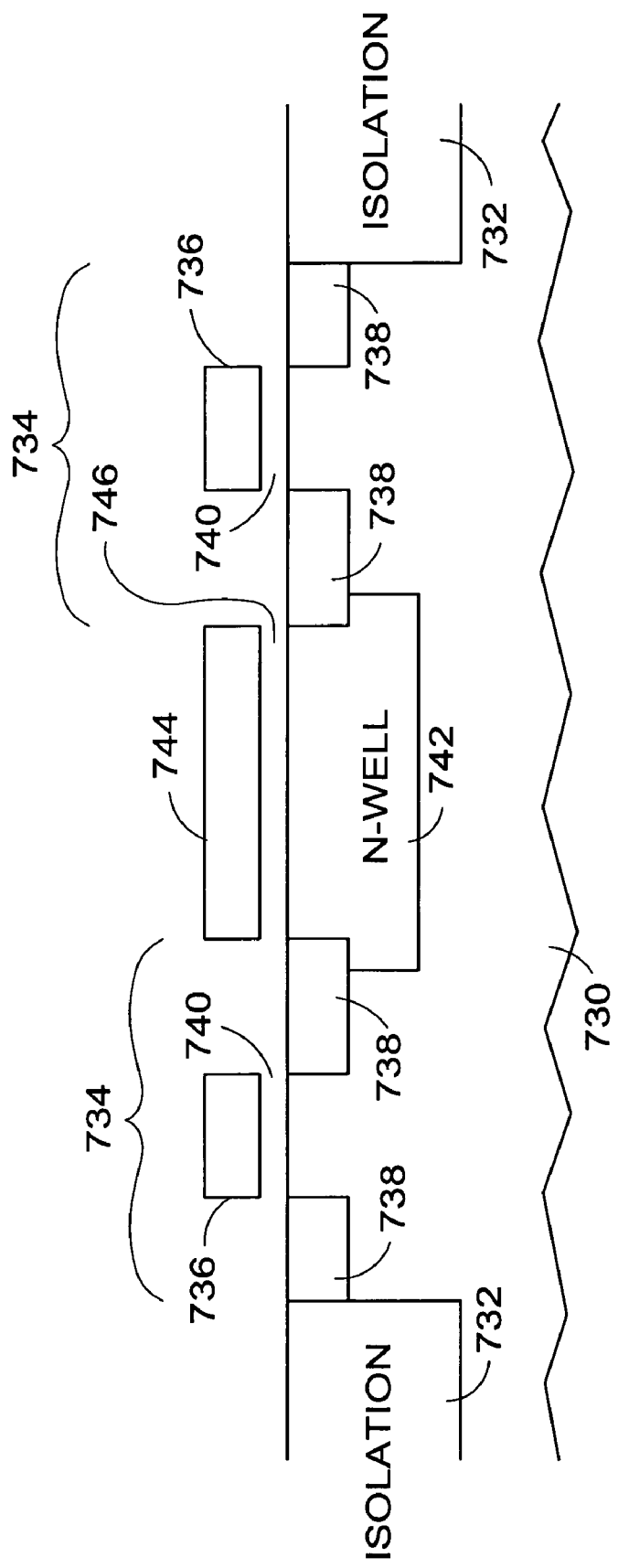
FIG. 7 is a schematic for an on-chip decoupling device.

FIG. 7 is a schematic for an on-chip decoupling device according to the present subject matter. A substrate 730 is provided with isolation regions 732. Control devices 734 are formed between isolation regions 732. Each control device 734 includes a gate 736 and two diffused regions 738 in the substrate 730. A gate insulator 740 separates the gate 736 from the diffused regions 738. An n-well 742 is formed between the two control devices 734. A decoupling capacitor plate 744 is formed over the n-well, and is separated from the n-well by a capacitor insulator structure 746. This capacitor insulator structure 746 provides the characteristics for the lossy decoupling capacitor. According to one embodiment, the fabrication of the insulator structure 746 is integrated with the processing of the gate insulator 740 of the control devices 734.

There are a number of variables that may be manipulated during the fabrication of the decoupling capacitor to achieve the desired values for the resistive and capacitive component ($R_{DC}$ and $C_{DC}$) of the decoupling capacitor. One of these manipulated variables, as taught by the present subject matter, is the K value of the dielectric used in the capacitor insulator structure 746. Other manipulated variables taught by the present subject matter include the distribution of nano crystals in the capacitor insulator structure 746 and the composition of the nano crystals. The nano crystals control the resistivity of the high K dielectric. Those of ordinary skill in the art will understand, upon reading and comprehending this disclosure, how to manipulate these and other variables to achieve the desired $R_{DC}$ and $C_{DC}$ for a decoupling capacitor.

FIG. 8-13 illustrate various embodiments of a MIS (metal-insulator-substrate) capacitor. The gate oxide for the capacitor insulator structure is a high K dielectric containing tailored amounts of nano crystals. According to various embodiments, these nano crystals are uniformly distributed or dispersed in the high K dielectric. According to one embodiment, the high K dielectric includes alumina ($Al_2O_3$). In one embodiment, silicon or gold nano crystals are uniformly distributed in $Al_2O_3$ by simultaneous sputtering, by implant, by ion-beam deposition or by vapor phase deposition. In one embodiment, silicon-rich alumina is deposited by chemical vapor deposition (CVD) technique to create a two phase insulator consisting of desired silicon nano crystals uniformly dispersed in $Al_2O_3$.

If the capacitor plate is a silicon plate, the insulator is capped with a thin (5 nm, for example) layer of injector SRN which adds an increased resistive component with negligible impact on capacitance. This is because, as was stated above, injector SRN provides appreciably enhanced charge conductance without providing appreciably enhanced charge trapping. Additionally, the injector SRN layer prevents dopant and impurity migration during subsequent high temperature processing. If the capacitor plate is a metal plate, one embodiment provides a thin layer of titanium nitride (TiN) to provide a diffusion barrier between the insulator and the metal interface. One embodiment uses the TiN layer as the top plate of the capacitor.

According to various embodiments, the capacitance of the decoupling capacitor is further enhanced by doping transition metals into the high K dielectric material. These transition metals include, but are not limited to, hafnium (Hf), tantalum (Ta), zirconium (Zr), and praseodymium (Pr). Additionally, a complex high K dielectric is used as the dielectric for the capacitor, or is doped with the high K dielectric for the capacitor. One such complex high K dielectric is barium strontium titanate ((BaSr) TiO$_3$) which is also known as BST. Other complex high K dielectrics include, but are not limited to, tantalum pentoxide (Ta$_2$O$_5$), titanium dioxide (TiO$_2$), tantalum nitride (TaN), zirconium oxide (ZrO$_2$) which is also known as zirconia, and praseodymium oxide (Pr$_2$O$_3$).

Figure 8:
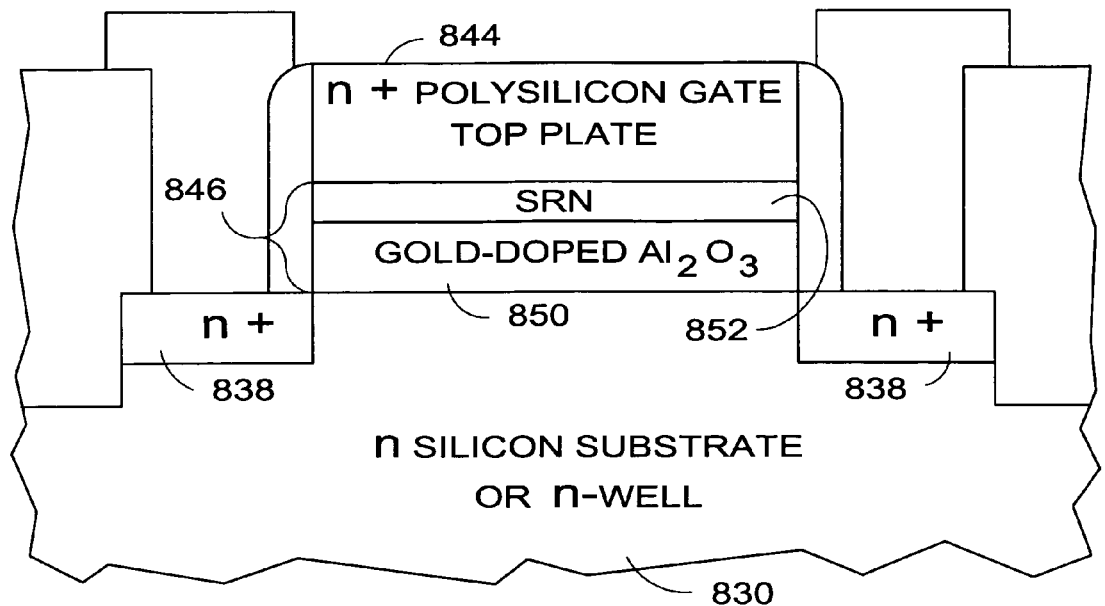
FIG. 8 illustrates one embodiment of a metal-insulator-silicon (MIS) capacitor formed over an n silicon substrate or an n-well.

FIG. 8 illustrates one embodiment of a MIS capacitor formed over an n silicon substrate or an n-well. According to this embodiment, a layer 850 of gold-doped Al$_2$O$_3$ is disposed on the substrate 830 and functions as the capacitor insulator structure 846. Gold-doped Al$_2$O$_3$ is Al$_2$O$_3$ doped with gold nano crystals. An injector layer 852, such as an injector SRN layer, is disposed on the gold-doped Al$_2$O$_3$. The top plate 844 of the capacitor is formed from n+ polysilicon.

Figure 9:
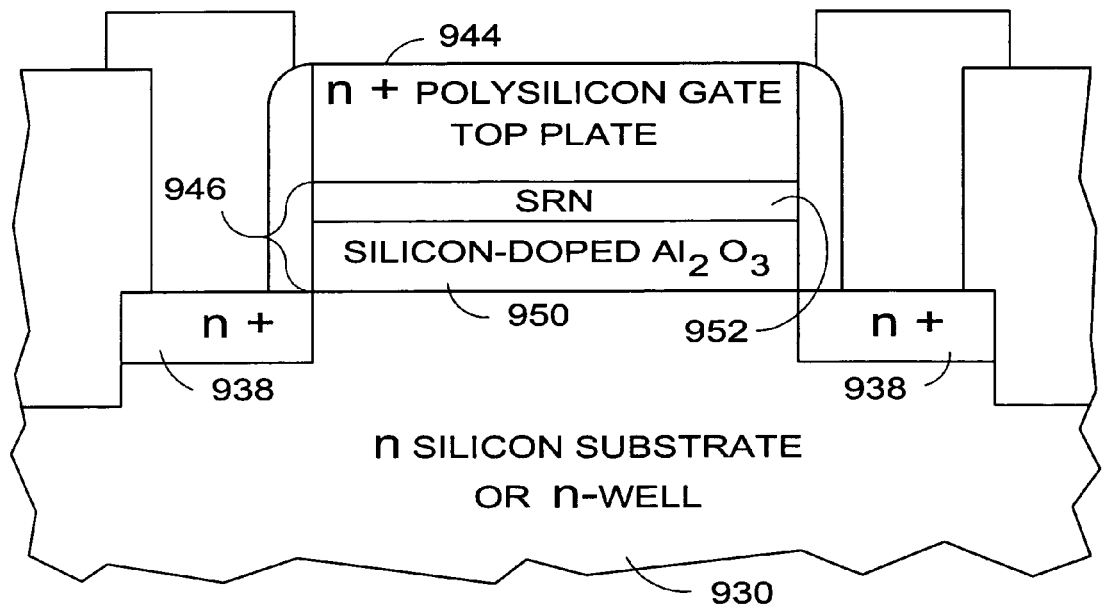
FIG. 9 illustrates another embodiment of a MIS capacitor formed over an n silicon substrate or an n-well.

FIG. 9 illustrates another embodiment of a MIS capacitor formed over an n silicon substrate or an n-well. According to this embodiment, a layer 950 of silicon-doped Al$_2$O$_3$ is disposed on the substrate 930 and functions as the capacitor insulator structure 946. Silicon-doped Al$_2$O$_3$ is Al$_2$O$_3$ doped with silicon nano crystals. An injector layer 952, such as an injector SRN layer, is disposed on the silicon-doped Al$_2$O$_3$. The top plate 944 of the capacitor is formed from n+ polysilicon.

Figure 10:
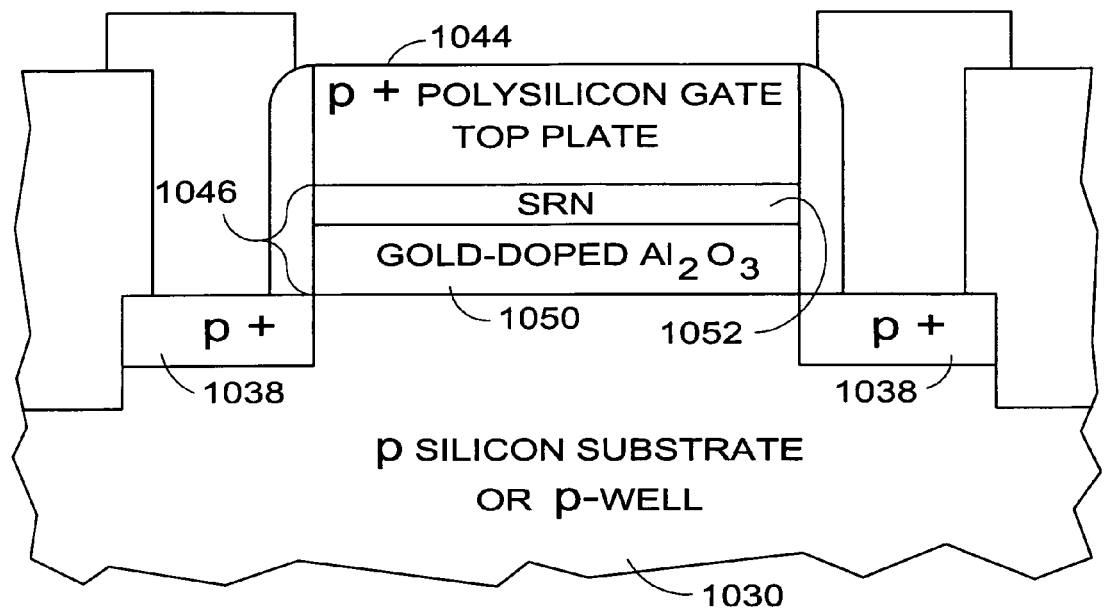
FIG. 10 illustrates another embodiment of a MIS capacitor formed over an p silicon substrate or a p-well.

FIG. 10 illustrates another embodiment of a MIS capacitor formed over an p silicon substrate or a p-well. According to this embodiment, a layer 1050 of gold-doped Al$_2$O$_3$ is disposed on the substrate 1030 and functions as the capacitor insulator structure 1046. An injector layer 1052, such as an injector SRN layer, is disposed on the gold-doped Al$_2$O$_3$. The top plate 1044 of the capacitor is formed from p+ polysilicon.

Figure 11:
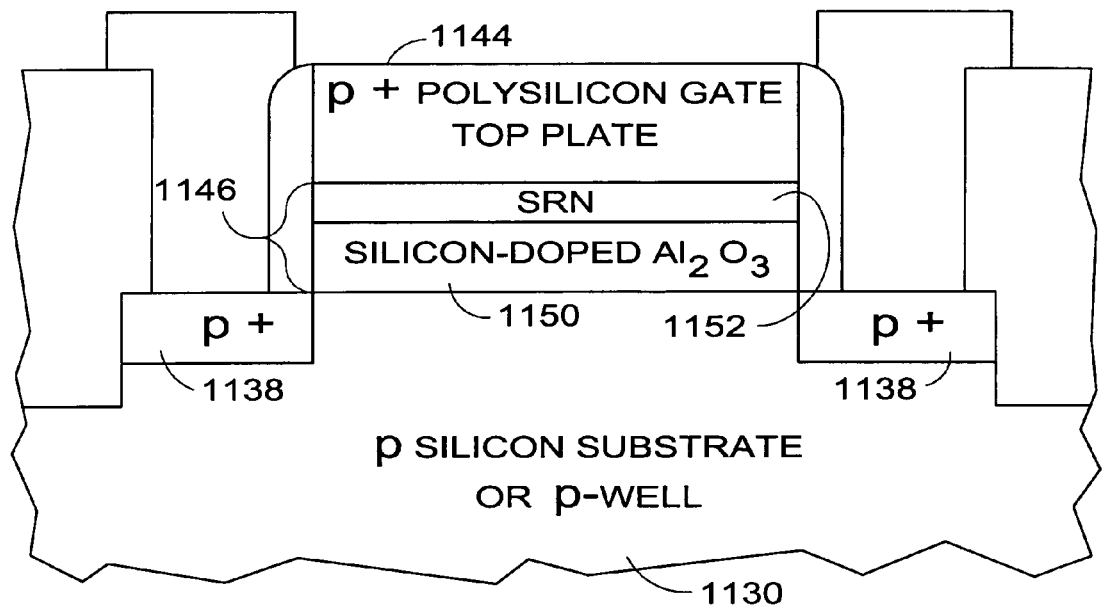
FIG. 11 illustrates another embodiment of a MIS capacitor formed over an p silicon substrate or a p-well.

FIG. 11 illustrates another embodiment of a MIS capacitor formed over an p silicon substrate or a p-well. According to this embodiment, a layer 1150 of silicon-doped Al$_2$O$_3$ is disposed on the substrate 1130 and functions as the capacitor insulator structure 1146. An injector layer 1152, such as an injector SRN layer, is disposed on the silicon-doped Al$_2$O$_3$. The top plate 1144 of the capacitor is formed from p+ polysilicon.

Figure 12:
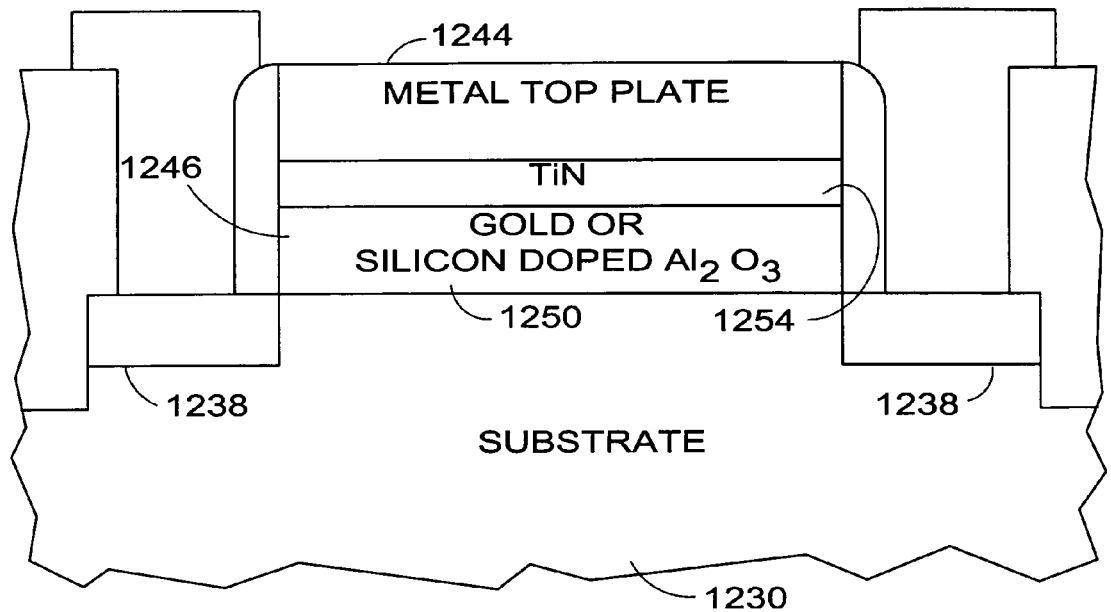
FIG. 12 illustrates one embodiment of a MIS capacitor with a metal top plate.

FIG. 12 illustrates one embodiment of a MIS capacitor with a metal top plate. According to this embodiment, a layer 1250 of gold-doped Al$_2$O$_3$ is disposed on the substrate 1230, and a TiN layer 1254 is disposed thereon. According to another embodiment, a layer 1250 of silicon-doped Al$_2$O$_3$ is disposed on the substrate 1230, and a TiN layer 1254 is disposed thereon. The top plate 1244 of the capacitor is formed from a metal.

Figure 13:
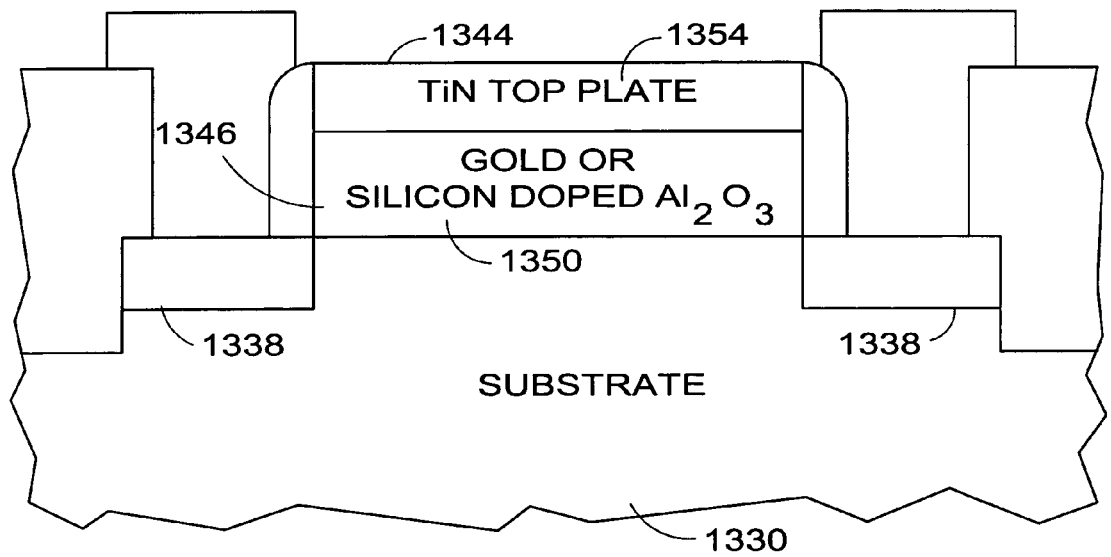
FIG. 13 illustrates another embodiment of a MIS capacitor with a metal top plate.

FIG. 13 illustrates another embodiment of a MIS capacitor with a metal top plate. According to this embodiment, a layer 1350 of gold-doped Al$_2$O$_3$ is disposed on the substrate 1330, and a TiN layer 1354 is disposed thereon. According to another embodiment, a layer 1350 of silicon-doped Al$_2$O$_3$ is disposed on the substrate 1330, and a TiN layer 1354 is disposed thereon. The TiN 1354 layer forms the top plate 1344 of the capacitor.

Figure 14:
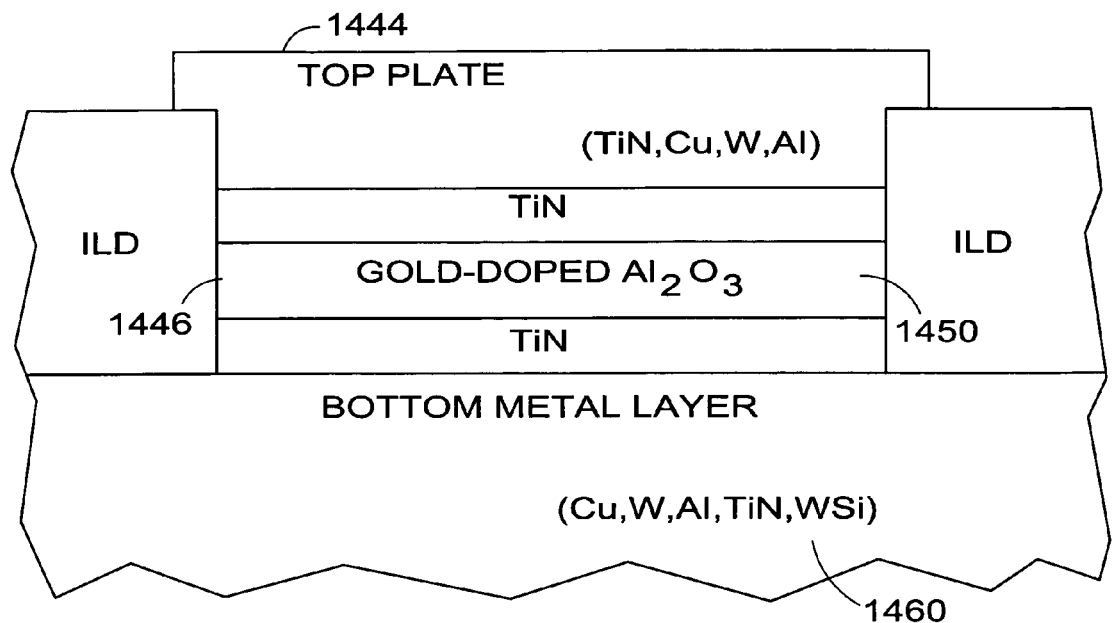
FIG. 14 illustrates one embodiment of a metal-insulator-metal (MIM) capacitor with gold nano crystals.
Figure 15:
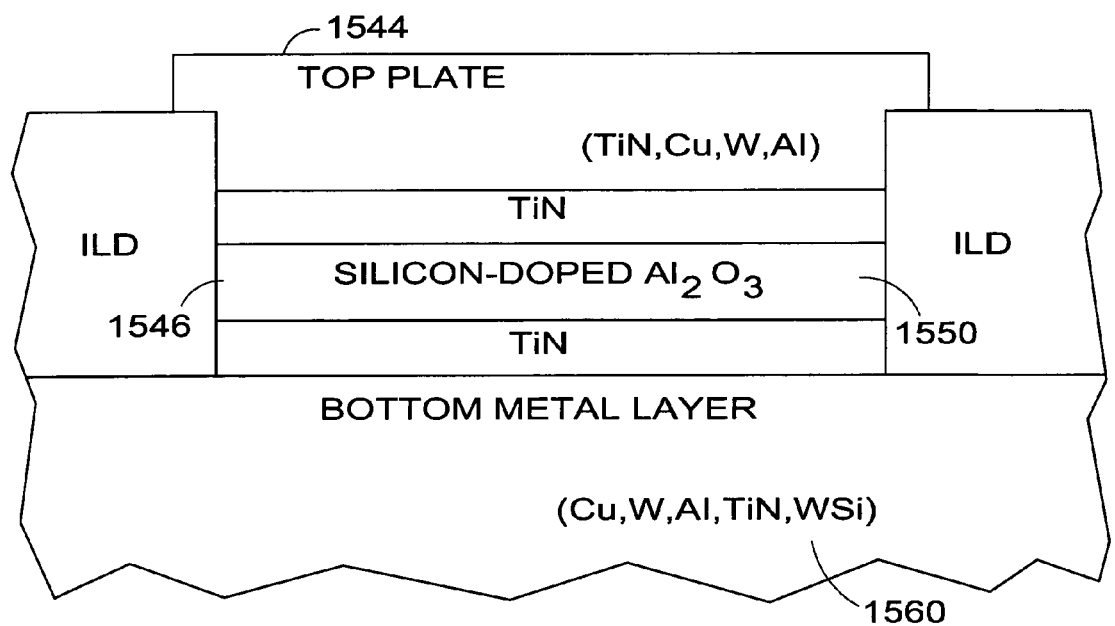
FIG. 15 illustrates another embodiment of a MIM capacitor with silicon nano crystals.

FIGS. 14-15 illustrate various embodiments of a MIM (metal-insulator-metal) capacitor. According to various embodiments, the MIM capacitor is fabricated on top of silicon and is appropriately connected to the V$_{DD}$/Gnd nodes, clock trees and active circuits. The insulator is a high K dielectric containing tailored amounts of nano crystals uniformly distributed or dispersed in the high K dielectric. Such insulator is usually fabricated at lower temperature than corresponding MIS options. The techniques used for fabrication include electron cyclotron resonance-plasma enhanced chemical vapor deposition (ECR-PECVD), atomic layer deposition (ALD), sputtering, E-Beam and Ion-Beam deposition of thin films.

According to one embodiment, the high K dielectric includes Al$_2$O$_3$. In one embodiment, ALD aluminum is deposited on top of a tungsten nitride (TiN), a tungsten (W) or tungsten silicide (WSi) electrode and subsequently oxidized in ozone plasma at low temperature. In one embodiment, silicon or gold nano crystals are uniformly distributed in Al$_2$O$_3$ by simultaneous sputtering, or by implant, or by vapor phase deposition. In one embodiment, silicon-rich alumina is deposited by CVD technique to create two phase insulator consisting of desired silicon nano crystals uniformly dispersed in Al$_2$O$_3$. According to various embodiments, the metal top plate is any metal such as titanium nitride (TiN), copper (Cu) or aluminum (Al).

According to various embodiments, the capacitance of the decoupling capacitor is further enhanced by doping transition metals into the high K dielectric such as Al$_2$O$_3$. These transition metals include, but are not limited to, hafnium (Hf), tantalum (Ta), zirconium (Zr), praseodymium (Pr). Additionally, a complex high K dielectric is used as the dielectric for the capacitor, or is doped with the high K dielectric for the capacitor. One such complex high K dielectric is barium strontium titanate ((BaSr) TiO$_3$) which is also known as BST. Other complex high K dielectrics include, but are not limited to, tantalum pentoxide (Ta$_2$O$_5$), titanium dioxide (TiO$_2$), tantalum nitride (TaN), zirconium oxide (ZrO$_2$) also known as zirconia, and praseodymium oxide (Pr$_2$O$_3$).

FIG. 14 illustrates one embodiment of a MIM capacitor with gold nano crystals. According to this embodiment, a first layer 1462 of TiN is disposed on the bottom metal layer 1460, a layer 1450 of gold-doped Al$_2$O$_3$ is disposed on the first layer of TiN 1462, a second layer 1444 of TiN is disposed on the layer 1450 of gold-doped Al$_2$O$_3$, and a top plate 1444 is formed on the second layer 1444 of TiN. According to various embodiments, the top plate is fabricated from titanium nitride (TiN), copper (Cu), tungsten (W) or aluminum (Al) and the bottom metal layer is fabricated from Cu, W, Al, TiN, or tungsten silicide (WSi).

FIG. 15 illustrates another embodiment of a MIM capacitor with silicon nano crystals. According to this embodiment, a first layer of TiN 1562 is disposed on the bottom metal layer 1560, a layer 1550 of silicon-doped Al$_2$O$_3$ is disposed on the first layer 1562 of TiN, a second layer 1564 of TiN is disposed on the layer 1550 of gold-doped Al$_2$O$_3$, and a top plate 1544 is formed on the second layer 1544 of TiN. According to various embodiments, the top plate is fabricated from TiN, Cu, W or Al and the bottom metal layer is fabricated from Cu, W, Al, TiN, or WSi.

Injector SRN was provided as an example of an injector medium in the above examples. One of ordinary skill in the art will understand, upon reading and comprehending this disclosure, that other materials may be used as an injector medium. These materials include silicon-rich aluminum nitride and SRO. Al$_2$O$_3$ is not an effective diffusion barrier for certain dopants like phosphorus for an n+ gate. The injector media SRN and silicon-rich aluminum nitride function as a diffusion barrier for doped polysilicon gates to prevent phosphorous, for example, from diffusing into Al$_2$O$_3$. A diffusion barrier is not needed if a metal gate is used.

Al$_2$O$_3$ was provided as an example of a high K charge blocking medium in the above examples. One of ordinary skill in the art will understand, upon reading and comprehending this disclosure, that other materials may be used as a high K charge medium. A high K charge medium is a material that has a K greater than the K of silicon. These materials include oxides, nitrides and silicates of tantalum, titanium, zirconium, hafnium and praseodymium. Additionally, these materials may further be doped with complex high K dielectrics such as barium strontium titanate (BST), transition metal, and metal oxides such as tantalum pentoxide ($Ta_2O_5$), titanium dioxide ($TiO_2$), tantalum nitride (TaN), zirconium oxide ($ZrO_2$), and praseodymium oxide ($Pr_2O_3$). Furthermore, thin films of these materials can be readily fabricated at near room temperature or at low temperature by several techniques including sputtering, ion beam deposition, and electron cyclotron resonance-plasma enhanced chemical vapor deposition (ECR-PECVD).

One of ordinary skill in the art will understand, upon reading and comprehending this disclosure, how the characteristics of these materials provide a number of variables that are capable of being manipulated to achieve the desired characteristics for the decoupling capacitor. That is, one of ordinary skill in the art will understand how to provide design solutions for significantly higher frequency ranges, lower voltages, and smaller feature sizes for future generations of integrated circuit design.

Furthermore, one of ordinary skill in the art will understand, upon reading and comprehending this disclosure, how to incorporate the decoupling capacitor into various integrated circuit designs for various components in a larger electronic system. Such an electronic system includes a processor or arithmetic/logic unit (ALU), a control unit, a memory device unit and an input/output (I/O) device. Generally, such an electronic system will have a native set of instructions that specify operations to be performed on data by the processor and other interactions between te processor, the memory device unit and the I/O devices. The memory device unit contains the data plus a stored list of instructions. The control unit coordinates all operations of the processor, the memory device and the I/O devices by continuously cycling through a set of operations that cause instructions to be fetched from the memory device and executed.

The figures presented and described in detail above are similarly useful in describing the method aspects of the present subject matter. One of ordinary skill in the art will understand these methods upon reading and comprehending this disclosure.

CONCLUSION

The present subject matter provides a decoupling capacitor for reducing resonance frequency and impedance in high frequency designs. The capacitor insulator structure of the decoupling capacitor includes a high K dielectric, and nano crystals dispersed through the high K dielectric. The distribution of the nano crystals and the composition of the nano crystals control the resistivity of the high K dielectric. Thus, the capacitor insulator structure provides a decoupling capacitor with a high K to provide an effective $C_{DC}$ in a relatively small area and with a built-in controlled $R_{DC}$ to control the resonance impedance and the resonance frequency of an integrated circuit chip. As such, smaller and faster integrate circuit design are achieved.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of forming a Metal-Insulator-Metal (MIM) decoupling capacitor for a circuit having a resonance impedance at an interconnect level on top of silicon, comprising:
   providing an electrode;
   providing a layer of alumina ($Al_2O_3$) on the electrode;
   doping the layer of $Al_2O_3$ with a selected distribution and composition of nano crystals to provide the layer of $Al_2O_3$ with a desired resistance to lower the resonance impedance of the circuit; and
   providing a metal top plate on the layer of $Al_2O_3$.

2. The method of claim 1, wherein providing a layer of $Al_2O_3$ on the electrode includes depositing a layer of Atomic Layer Deposition (ALD) aluminum on the electrode, and oxidizing the layer of ALD aluminum in ozone plasma at low temperature.

3. The method of claim 1, wherein providing a layer of $Al_2O_3$ on the electrode includes depositing a layer of $Al_2O_3$ by ion beam deposition.

4. The method of claim 1, wherein providing a layer of $Al_2O_3$ on the electrode includes depositing a layer of $Al_2O_3$ by sputtering.

5. The method of claim 1, wherein providing a layer of $Al_2O_3$ on the electrode includes depositing a layer of $Al_2O_3$ by electron cyclotron resonance-plasma enhanced chemical vapor deposition (ECR-PECVD).

6. The method of claim 1, wherein providing an electrode includes providing a titanium nitride (TiN) electrode.

7. The method of claim 1, wherein providing an electrode includes providing a tungsten (W) electrode.

8. The method of claim 1, wherein providing an electrode includes providing a tungsten silicide (WSi) electrode.

9. The method of claim 1, wherein providing an electrode includes providing a copper (Cu) electrode.

10. The method of claim 1, wherein providing an electrode includes providing an aluminum (Al) electrode.

11. The method of claim 1, wherein doping the layer of alumina with nano crystals includes doping the layer of alumina with gold nano crystals.

12. The method of claim 1, wherein doping the layer of alumina with nano crystals includes doping the layer of alumina with silicon nano crystals.

13. The method of claim 1, wherein providing a metal top plate on the layer of alumina includes providing a titanium nitride (TiN) top plate.

14. The method of claim 1, wherein providing a metal top plate on the layer of alumina includes providing an aluminum (Al) top plate.

15. The method of claim 1, wherein providing a metal top plate on the layer of alumina includes providing a copper (Cu) top plate.

16. The method of claim 1, wherein providing a metal top plate on the layer of alumina includes providing a tungsten (W) top plate.

17. The method of claim 1, further comprising doping the layer of alumina with at least one transition metal.

18. The method of claim 1, further comprising doping the layer of alumina with a complex high K dielectric.

19. A method of forming a Metal-Insulator-Metal (MIM) decoupling capacitor, comprising:
providing an electrode;
providing a layer of high K dielectric over the electrode;
doping the layer of high K dielectric with a selected distribution and composition of nano crystals to control the resistivity of the high K dielectric layer; and
providing a metal top plate on the high K dielectric.

20. The method of claim 19, wherein providing a high K dielectric on the electrode includes providing a tantalum oxide on the electrode.

21. The method of claim 19, wherein providing a high K dielectric on the electrode includes providing a titanium oxide on the electrode.

22. The method of claim 19, wherein providing a high K dielectric on the electrode includes providing a zirconium oxide on the electrode.

23. The method of claim 19, wherein providing a high K dielectric on the electrode includes providing a hafnium oxide on the electrode.

24. The method of claim 19, wherein providing a high K dielectric on the electrode includes providing a praseodymium oxide on the electrode.

25. The method of claim 19, further comprising providing a first titanium nitride layer on the electrode, wherein providing a high K dielectric over the electrode includes providing an aluminum oxide layer on the first titanium nitride layer, further comprising providing a second titanium nitride layer on the aluminum oxide layer, wherein providing a metal top plate on the high K dielectric includes providing a metal top plate on the second titanium nitride layer.

26. The method of claim 19, wherein:
providing an electrode includes providing an electrode that includes a metal selected from the group consisting of: copper, tungsten, aluminum, titanium nitride, and tungsten silicide; and
providing a metal top plate that includes a metal selected from the group consisting of: titanium nitride, copper, tungsten and aluminum.

27. A method of forming a Metal-Insulator-Metal (MIM) capacitor for a circuit having a resonance impedance, comprising:
providing an electrode;
providing a high K dielectric over the electrode;
doping the high K dielectric with a selected distribution and composition of nano crystals and a complex high K dielectric to provide the layer of high K dielectric with a desired resistance to lower the resonance impedance of the circuit; and
providing a metal top plate on the high K dielectric.

28. The method of claim 27, wherein the complex high K dielectric includes barium strontium titanate (BST).

29. The method of claim 27, wherein the complex high K dielectric includes a transition metal.

30. The method of claim 27, wherein the complex high K dielectric includes a metal oxide.

31. The method of claim 30, wherein the metal oxide includes tantalum.

32. The method of claim 30, wherein the metal oxide includes zirconium.

33. The method of claim 30, wherein the metal oxide includes praseodymium.

34. A method of forming a Metal-Insulator-Metal (MIM) capacitor, comprising:
providing an electrode;
fabricating a high K dielectric layer over the electrode, including performing a low-temperature fabrication process near room temperature;
doping the high K dielectric layer with a selected distribution and composition of nano crystals thereby controlling the resistivity of the high K dielectric layer; and
providing a metal top plate on the high K dielectric.

35. The method of claim 34, wherein performing a low-temperature fabrication process near room temperature includes performing a sputtering process.

36. The method of claim 34, wherein performing a low-temperature fabrication process near room temperature includes performing an ion beam deposition process.

37. The method of claim 34, wherein performing a low-temperature fabrication process near room temperature includes performing an electron cyclotron resonance-plasma enhanced chemical vapor deposition process (ECR-PECVD).

38. A method of forming a Metal-Insulator-Metal (MIM) capacitor, comprising:
providing an electrode;
providing a high K dielectric layer over the electrode;
doping the high K dielectric layer with a selected distribution and composition of silicon nano crystals thereby controlling the resistivity of the high K dielectric layer; and
providing a metal top plate on the high K dielectric.

39. The method of claim 38, wherein:
providing an electrode includes providing an electrode that includes a metal selected from the group consisting of: copper, tungsten, aluminum, titanium nitride, and tungsten silicide; and
providing a metal top plate includes providing a metal top plate that includes a metal selected from the group consisting of: titanium nitride, copper, tungsten and aluminum.

40. The method of claim 38, wherein:
providing a high K dielectric includes providing a dielectric selected from the group consisting of: an aluminum oxide, a tantalum oxide, a titanium oxide, a tantalum nitride, a tantalum silicate, a zirconium oxide, a zirconium nitride, a zirconium silicate, a hafnium oxide, a hafnium nitride, a hafnium silicate, a praseodymium oxide, a praseodymium nitride and a praseodymium silicate.

41. The method of claim 40, further comprising doping the high K dielectric with a complex high K dielectric selected from the group consisting of: barium strontium titanate (BST), a transition metal, and a metal oxide.

42. The method of claim 41, wherein the metal oxide is selected from the group consisting of a tantalum oxide, a zirconium oxide and a praseodymium oxide.

43. A method of forming a Metal-Insulator-Metal (MIM) capacitor, comprising:
providing an electrode;
providing a high K dielectric layer over the electrode;
doping the high K dielectric layer with a selected distribution and composition of gold nano crystals to control the resistivity of the high K dielectric layer; and
providing a metal top plate on the high K dielectric.

44. The method of claim 43, wherein:
providing an electrode includes providing an electrode that includes a metal selected from the group consisting of: copper, tungsten, aluminum, titanium nitride, and tungsten silicide; and
providing a metal top plate that includes a metal selected from the group consisting of: titanium nitride, copper, tungsten and aluminum.

45. The method of claim 43, wherein:
providing a high K dielectric includes providing a dielectric selected from the group consisting of: an aluminum oxide, a tantalum oxide, a titanium oxide, a tantalum nitride, a tantalum silicate, a zirconium oxide, a zirconium nitride, a zirconium silicate, a hafnium oxide, a hafnium nitride, a hafnium silicate, a praseodymium oxide, a praseodymium nitride and a praseodymium silicate.

46. The method of claim 45, further comprising doping the high K dielectric with a complex high K dielectric selected from the group consisting of: barium strontium titanate (BST), a transition metal, and a metal oxide.

47. The method of claim 46, wherein the metal oxide is selected from the group consisting of a tantalum oxide, a zirconium oxide and a praseodymium oxide.

48. A method of forming a Metal-Insulator-Metal (MIM) capacitor, comprising:
providing an electrode;
providing a first titanium nitride layer on the electrode;
providing on the titanium oxide layer a high K dielectric layer doped with a selected distribution and composition of nano crystals to control the resistivity of the high K dielectric layer;
providing a second titanium nitride layer on the high K dielectric layer; and
providing a metal top plate on the second titanium nitride layer.

49. The method of claim 48, wherein:
providing an electrode includes providing an electrode that includes a metal selected from the group consisting of: copper, tungsten, aluminum, titanium nitride, and tungsten suicide; and
providing a metal top plate includes providing a metal top plate that includes a metal selected from the group consisting of: titanium nitride, copper, tungsten and aluminum.

50. The method of claim 48, wherein:
providing a high K dielectric includes providing a dielectric selected from the group consisting of: an aluminum oxide, a tantalum oxide, a titanium oxide, a tantalum nitride, a tantalum silicate, a zirconium oxide, a zirconium nitride, a zirconium silicate, a hafnium oxide, a hafnium nitride, a hafnium silicate, a praseodymium oxide, a praseodymium nitride and a praseodymium silicate.

51. The method of claim 50, further comprising doping the high K dielectric with a complex high K dielectric selected from the group consisting of: barium strontium titanate (BST), a transition metal, and a metal oxide.

52. The method of claim 51, wherein the metal oxide is selected from the group consisting of a tantalum oxide, a zirconium oxide and a praseodymium oxide.

* * * * *

UNITED STATES PATENT AND TRADEMARK OFFICE
CERTIFICATE OF CORRECTION

PATENT NO. : 7,442,633 B2  Page 1 of 1
APPLICATION NO. : 11/209425
DATED : October 28, 2008
INVENTOR(S) : Bhattacharyya It is certified that error appears in the above-identified patent and that said Letters Patent is hereby corrected as shown below:

On the face page, in field (57), under "Abstract", in column 2, line 9, after "gold nano crystals" delete "and gold nano crystals".

In column 11, line 35, in Claim 26, after "wherein:" delete "providing an electrode includes.".

In column 12, line 34, in Claim 39 after "wherein:" delete "providing an electrode includes".

In column 12, line 38, in Claim 39, after "and" delete "providing a metal top plate includes".

In column 13, line 2, in Claim 44, after "wherein:" delete "providing an electrode includes".

In column 14, line 6, in Claim 49, after "wherein:" delete "providing an electrode includes".

In column 14, line 9, in Claim 49, delete "suicide" and insert -- silicide --, therefor.

In column 14, line 10, in Claim 49, after "and" delete "providing a metal top plate includes".

Signed and Sealed this

Nineteenth Day of May, 2009

JOHN DOLL
*Acting Director of the United States Patent and Trademark Office*